US007276958B2

(12) United States Patent
Miyamitsu et al.

(10) Patent No.: US 7,276,958 B2
(45) Date of Patent: Oct. 2, 2007

(54) CHARGE PUMP WITH REDUCED NOISE SPIKES

(75) Inventors: Fumiaki Miyamitsu, Tokyo (JP); Eizo Fukui, Oita-ken (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/287,352

(22) Filed: Nov. 4, 2002

(65) Prior Publication Data

US 2003/0085755 A1 May 8, 2003

(30) Foreign Application Priority Data

Nov. 8, 2001 (JP) ............................ 2001-343315

(51) Int. Cl.
*H03K 17/16* (2006.01)
*G05F 3/08* (2006.01)

(52) U.S. Cl. ..................... 327/536; 327/112; 327/201; 363/59

(58) Field of Classification Search ................ 327/112, 327/309, 535, 536, 537, 541, 543; 363/59, 363/60

See application file for complete search history.

(56) References Cited

U.S. PATENT DOCUMENTS 5,191,232 A * 3/1993 Wang ......................... 327/534
5,446,418 A * 8/1995 Hara et al. ..................... 331/57
6,064,275 A * 5/2000 Yamauchi ..................... 331/57
6,075,403 A * 6/2000 Ishikawa et al. ............ 327/536
6,100,752 A * 8/2000 Lee et al. ................... 327/536
6,307,407 B1 * 10/2001 Fukui ......................... 327/112
6,373,295 B2 * 4/2002 Kadanka et al. ............ 327/112
6,469,569 B1 * 10/2002 Miyamitsu .................. 327/536

OTHER PUBLICATIONS

Graf, Rudolf F., Modern Dictionary of Electronics, Seventh Edition, Newnes, 1999, p. 166 ("current source").*

* cited by examiner

*Primary Examiner*—Kenneth B. Wells
*Assistant Examiner*—Terry L. Englund
(74) *Attorney, Agent, or Firm*—William B Kempler; W. James Brady, III; Frederick J. Telecky, Jr.

(57) ABSTRACT

A voltage supply circuit which suppresses generation of current spikes in the power source current in operation, reduce noise, simplify the circuit configuration, and decrease the cost. Clock signal CLK at a prescribed frequency is supplied to charge pump driver (10); current sources IS1, IS2, . . . IS6 work at timing set with clock signal CLK to output driving currents; and, corresponding to the driving currents, capacitors C1, C2 . . . are alternately charged or discharged; the charge stored in the capacitor of a preceding stage is sequentially sent to the later capacitor stage, and a boosted voltage higher than power source voltage Vcc is obtained at output terminal $T_2$. In the charge pump type booster, since capacitors are driven with current sources, it is possible to reduce spike noise in the boosting operation, and influence on other analog circuits can be suppressed.

7 Claims, 2 Drawing Sheets

CHARGE PUMP WITH REDUCED NOISE SPIKES

FIELD OF THE INVENTION

This invention pertains to a type of voltage supply circuit. In particular, this invention pertains to a type of voltage supply circuit that uses a charge pump booster to supply a voltage different from the power source voltage.

BACKGROUND OF THE INVENTION

In order to generate a voltage different from a power source voltage, e.g., a voltage higher than the power source voltage, usually, a switching power source using inductance elements or a charge pump type booster using capacitance elements is used.

FIG. 4 is a diagram illustrating an example of a voltage supply circuit using a charge pump type booster. As shown in the figure, in this voltage supply circuit, the booster is composed of plural sections of diodes D1, D2, . . . Dn that are connected in series in the same direction between supply terminal $T_1$ of power source voltage $V_{cc}$ and output terminal $T_2$ of the boosted voltage, capacitors C1, C2, . . . wherein each has one electrode connected between said diodes and a driving signal is input to the other electrode, a charge pump driver that supplies said driving signal to said capacitors C1, C2, . . . , and output capacitor $C_{out}$ that smoothens the output voltage.

Corresponding to the input clock signal CLK, the charge pump driver generates two driving voltages with phases inverted from one another at the same frequency as that of clock signal CLK, and they are alternately input to capacitors C1, C2, . . .

By means of the charge pump type booster with the aforementioned constitution, capacitors C1, C2, . . . set as charge pumps perform charging/discharge alternately according to the input driving voltage. As a result, a voltage higher than power source voltage Vcc is obtained from output terminal $T_2$. By setting an appropriate number of sections of booster corresponding to the power source voltage Vcc, a desired high voltage can be generated.

However, for the aforementioned conventional charge pump type booster or switching power source, a large current spike takes place in the switching operation. Consequently, when an analog circuit coexists, noise may be mixed into the analog circuit due to crosstalk.

FIG. 5 is a waveform diagram illustrating the waveform of clock signal CLK and power source current $I_s$. As shown in the figure, in each half period of the clock signal, a switching operation is performed in the charge pump driver. Consequently, current spike results. That is, in the charge pump type booster, noise is generated at a frequency twice that of the clock signal supplied to the charge pump driver.

As said noise cannot be reduced in the operation principle, in order to suppress its influence, it is necessary to change the configuration of the circuit elements or to take other measures for reducing the crosstalk, or to shield against transport of noise. As a result, the circuit constitution becomes complicated, and the cost is increased. This is undesired.

A general object of this invention is to solve the aforementioned problems of conventional methods by providing a type of voltage supply circuit characterized by the fact that it can suppress generation of current spikes in operation, so that it can reduce noise, with a simpler circuit configuration and a lower cost.

SUMMARY OF THE INVENTION

This and other objects and features are attained in accordance with one aspect of this invention by a voltage supply circuit comprising a first diode with its anode connected to the voltage supply terminal; a first capacitor connected between the cathode of said first diode and a first node; a first current source that is connected between the voltage supply terminal and said first node and supplies a first current to said first node corresponding to a first clock signal; a second current source that is connected between said first node and the ground potential, and supplies a second current to said first node corresponding to a second clock signal that is complementary to said first clock signal; a second diode connected to the cathode of said first diode; a second capacitor connected between the cathode of said second diode and a second node; a third current source that is connected between the voltage supply terminal and said second node, and supplies a third current to said second node corresponding to said second clock signal; and a fourth current source that is connected between said second node and the ground potential, and supplies a fourth current to said second node corresponding to said first clock signal.

In addition, according to another aspect of this invention, it preferably has a voltage holding means for holding said first node and said second node within a prescribed voltage range.

Also, according to a further aspect of this invention, said voltage holding means preferably has a first npn transistor that is connected between the voltage supply terminal and said first node, and has a first bias applied on its base; a second npn transistor which is connected between the voltage supply terminal and said second node, and has said first bias voltage applied on its base; a first pnp transistor that is connected between said first node and the ground potential, and has a second bias voltage higher than said first bias voltage applied on its base; and a second pnp transistor that is connected between said second node and the ground potential, and has said second bias voltage applied on its base.

Also, according to a still further aspect of this invention, said first and second diodes are preferably Schottky diodes.

REFERENCE NUMERALS AND SYMBOLS AS SHOWN IN THE DRAWINGS

In the figures 10, 100 represent a charge pump driver, Vcc a power source voltage, GND a ground potential

DESCRIPTION OF THE EMBODIMENTS

First Embodiment

Figure 1:
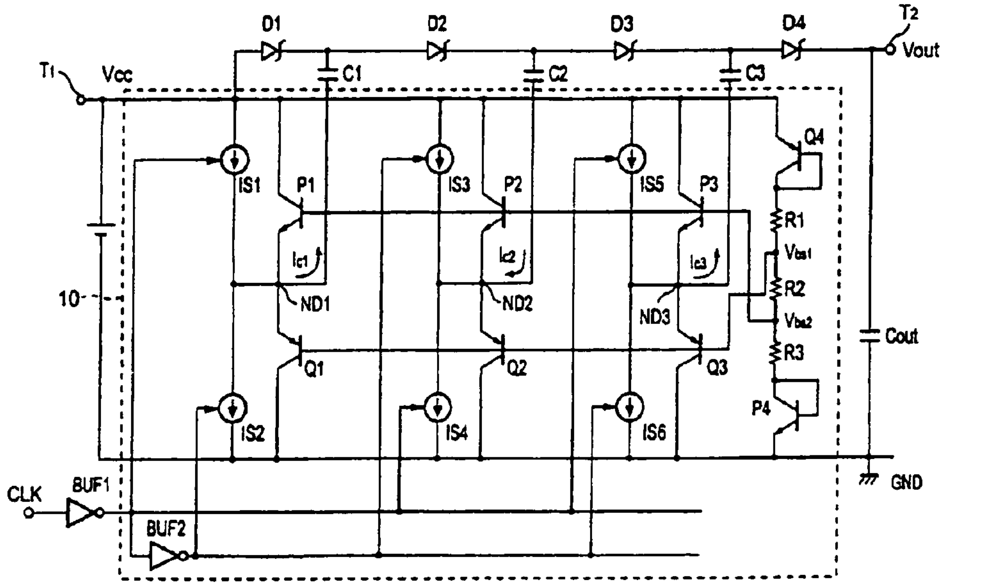
FIG. 1 is a circuit diagram illustrating a first embodiment of the voltage supply circuit in this invention.

FIG. 1 is a circuit diagram illustrating a first embodiment of the voltage supply circuit of this invention.

As shown in the figure, the voltage supply circuit in this embodiment is composed of diodes D1, D2, D3, D4, capacitors C1, C2, C3, $C_{out}$ and charge pump driver (10).

As shown in FIG. 1, diodes D1, D2, D3, D4 are connected in series between power source voltage terminal $T_1$ and output terminal $T_2$.

For capacitors C1, C2, C3, the electrodes on one side are connected to the cathodes of diodes D1, D2, D3, respectively, and the electrodes on the other side are connected to nodes ND1, ND2, ND3 of charge pump driver (10).

Capacitor $C_{out}$ is connected between output terminal $T_2$ and ground potential GND, and it is for smoothening of output voltage $V_{out}$.

The voltage supply circuit in this embodiment consists of a charge pump type booster. Driver (10) supplies driving currents to capacitors C1, C2, C3 that operate as charge pumps. These capacitors perform charging/discharge alternately corresponding to the driving current supplied to them. As a result, voltage $V_{out}$ higher than power source voltage Vcc is obtained at output terminal $T_2$.

Also, as an example, FIG. 1 illustrates a booster composed of three booster sections. However, for a practical voltage supply circuit, the number of booster sections can be selected appropriately corresponding to power source voltage Vcc and the desired output voltage $V_{out}$.

In the following, the constitution of charge pump driver (10) will be considered.

As shown in the figure, charge pump driver (10) is composed of current sources IS1, IS2, IS3, IS4, IS5, IS6, npn transistors P1, P2, P3, P4, pnp transistors Q1, Q2, Q3, Q4, and resistors R1, R2, R3.

Current source IS1 is connected between the supply line of power source voltage Vcc and node ND1, and current source IS2 is connected between node ND1 and ground potential GND. The collector of transistor P1 is connected to the supply line of power source voltage Vcc, and its emitter is connected to node ND1. The emitter of transistor Q1 is connected to node ND1, and its collector is connected to ground.

Current sources IS1 and IS2 are controlled with phase inverted clock signals, respectively. Said current sources output a constant current corresponding to the clock signal.

Similarly, current source IS3 is connected between the supply line of power source voltage Vcc and node ND2, and current source IS4 is connected between node ND2 and ground potential GND. The collector of transistor P2 is connected to the supply line of power source voltage Vcc, and its emitter is connected to node ND2. The emitter of transistor Q2 is connected to node ND2, and its collector is grounded.

In addition, current source IS5 is connected between the supply line of power source voltage Vcc and node ND3, and current source IS6 is connected between node ND3 and ground potential GND. The collector of transistor P3 is connected to the supply line of power source voltage Vcc, and its emitter is connected to node ND3. The emitter of transistor Q3 is connected to node ND3, and its collector is grounded.

Current sources IS1, IS4, IS5 are controlled with an in-phase clock signal, and current sources I52, I53, I56 are controlled with a clock signal that is phase inverted with respect to said clock signal. Also, all of the current sources output same current I when they are on.

For example, when clock signal CLK input to charge pump driver (10) is on the lower level, the output of buffer BUF1 is on a high level, and the output of buffer BUF2 is held on a low level. As a result, current sources IS1, IS4, IS5 output current I, respectively. In this case, current sources IS2, IS3, IS6 do not work, and no current is output.

On the other hand, when clock signal CLK is held on a high level, the output of buffer BUF1 is held on the low level, and the output of buffer BUF2 is held on the high level. As a result, current sources IS1, IS4, IS5 do not work, and no current is output. On the contrary, current sources IS2, IS3, IS6 work, and each of them outputs current I.

Transistor Q4, resistors R1, R2, R3 and transistor P4 are connected in series between the supply line of power source voltage Vcc and ground potential GND. For transistor Q4, the emitter is connected to the supply line of power source voltage Vcc, and its base and collector are connected to resistor R1. Also, for transistor P4, the collector and base are connected to resistor R3, and the emitter is grounded. That is, transistors Q4 and P4 work as a diode.

From the connecting point between resistors R1 and R2, bias voltage $V_{bs1}$ is generated, and bias voltage $V_{bs2}$ is generated from the connecting point between resistors R2 and R3. Bias voltage $V_{bs1}$ is applied on the bases of transistors Q1, Q2, Q3, and bias voltage $V_{bS2}$ is applied on the bases of transistors P1, P2, P3.

Here, for example, when power source voltage Vcc is at 5V, transistors Q4, P4 and the resistance values of resistors R1, R2, R3 are selected such that bias voltages $V_{bs1}$ and $V_{bs2}$ are 4 V and 1 V, respectively.

In charge pump driver (10) with the aforementioned constitution, a voltage clamp circuit is composed of npn transistors P1, P2, P3, pnp transistors Q1, Q2, Q3, transistors Q4, P4 that generate bias voltages $V_{bs1}$ and $V_{bs2}$, respectively, and resistors R1, R2, R3. This voltage clamp circuit acts to keep the voltages of nodes ND1, ND2, and ND3 within a prescribed range.

For example, assuming that the base-emitter voltage is $V_{bep}$ for npn transistors P1, P2, P3, and the base-emitter voltage is $V_{ben}$ for pnp transistors Q1, Q2, Q3, when voltage $V_{ND1}$ of node ND1 is lower than bias voltage $V_{bs2}$ by base-emitter voltage $V_{bep}$, that is, when $V_{ND1}<V_{bs2}-V_{bep}$, transistor P1 is ON. Otherwise, transistor P1 is OFF.

Similarly, when voltage $V_{ND1}$ of node ND1 is higher than bias voltage $V_{bs1}$ by base-emitter voltage $V_{ben}$, that is, when $V_{ND1}>V_{bs1}+V_{ben}$, transistor Q1 is ON. Otherwise, transistor Q1 is OFF.

As a result, voltage $V_{ND1}$ of node ND1 is kept in the range of being larger than $V_{bs2}-V_{bep}$ and smaller than $V_{bs1}+V_{ben}$. That is, the state is always such that $V_{bs2}-V_{bep}<V_{ND1}>V_{bs1}+V_{ben}$. Also, just like node ND1, the other nodes ND2 and ND3 are kept within the prescribed voltage range.

In the following, operation of charge pump driver (10) and the overall booster in this embodiment will be considered with reference to FIG. 1.

Clock signal CLK at a prescribed frequency is supplied to charge pump driver (10), and a clock signal that is complementary to the output of buffers BUF1 and BUF2 is generated. Current sources IS1, IS2, . . . IS6 are controlled with the complementary clock signals, and they operate at respective timings to output constant current I.

For example, when clock signal CLK is on the low level, the output of buffer BUF1 is kept on the high level, and the output of buffer BUF2 is kept on the low level. Consequently, current sources IS1, IS4 and IS5 work corresponding to this state, and they output constant current I. On the other hand, in this case, current sources IS2, IS3, and IS6 do not work. Consequently, as shown in the figure, current $I_{c1}$ flows from node ND1 to capacitor C1. Similarly, current $I_{c3}$ flows from node ND3 to capacitor C3. On the other hand, current $I_{C2}$ flows from capacitor C2 to node ND2.

As a result, the charge stored in capacitor C1 is sent through diode D2 to capacitor C2, and the charge stored in capacitor C3 is sent through diode D4 to output terminal $T_2$.

Then, when clock signal CLK is on the high level, the output of buffer BUF1 is kept on the low level, and the output of buffer BUF2 is kept on the high level. As a result, current sources IS2, IS3 and IS6 work, and they output constant current I, respectively. Also, in this case, current sources IS1, IS4 and IS5 do not work. Consequently, current $I_{c1}$ flows opposite to the current direction shown in FIG. 1, that is, it flows from capacitor C1 to node ND1. Similarly, current $I_{c3}$ flows from capacitor C3 to node ND3. On the other hand, current $I_{c2}$ flows from node ND2 to capacitor C2.

As a result, charge is injected from the side of power source voltage Vcc through diode D1 to capacitor C1. Also, the charge stored in capacitor C2 is sent through diode D3 to capacitor C3.

As the current value is I for current sources IS1, IS2, . . . IS6, and the current supplied from power source voltage Vcc through diode D1 to capacitor C1 is also I, in the boosting operation, the sum of the currents supplied from power source voltage Vcc to charge pump driver (10) and initial-stage diode D1 is always kept at constant current value 2I. That is, in the voltage supply circuit of this embodiment, by changing the conventional voltage source driving system to a current source driving system in the charge pump booster, it is possible to suppress generation of current spikes accompanying the boosting operation. Consequently, even when a voltage supply circuit using a booster and another analog circuit are mixed, it is still possible to reduce noise from mixing into the analog circuit due to crosstalk, and it is possible to improve the noise characteristics of the circuit.

As explained above, in this embodiment, when clock signal CLK at a prescribed frequency is supplied to charge pump driver (10), in charge pump driver (10), current sources IS1, IS2, . . . IS6 work at a prescribed timing set with clock signal CLK, and they output the driving currents. Corresponding to these driving currents, capacitor C1, C2, . . . are alternately charged/discharged, and the charge stored in the capacitor of a preceding boosting stage is sent sequentially to the later boosting stages. Consequently, a voltage that is boosted for each boosting stage is generated, and a voltage higher than power source voltage Vcc is obtained from output terminal $T_2$. Also, in the charge pump type booster, because capacitors are driven by current sources, it is possible to reduce spike noise in the boosting operation, and it is possible to reduce the influence of said noise on other analog circuits.

Second Embodiment

Figure 2:
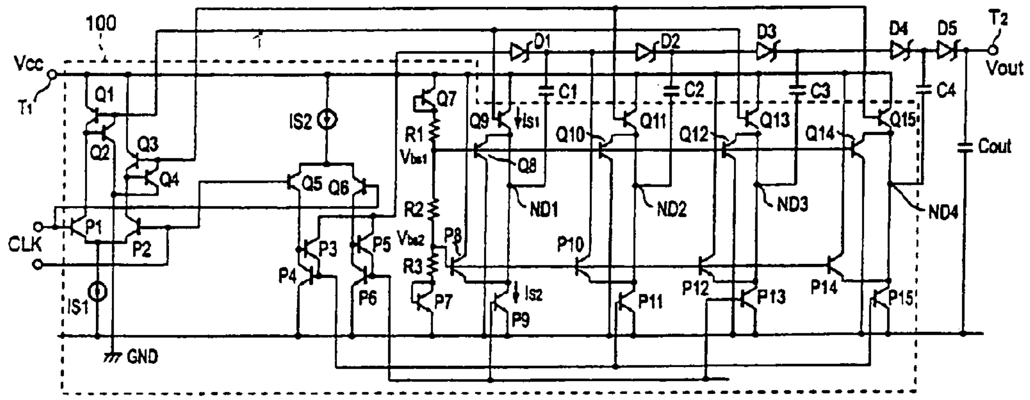
FIG. 2 is a circuit diagram illustrating a second embodiment of the voltage supply circuit in this invention.

FIG. 2 is a circuit diagram illustrating a second embodiment of the voltage supply circuit of this invention. It shows a specific circuit configuration example of a voltage supply circuit.

As shown in the figure, the voltage supply circuit in this embodiment is composed of diodes D1, D2, D3, D4, D5, capacitors C1, C2, C3, C4, $C_{out}$, and charge pump driver (100).

Diodes D1, D2, D3, D4, D5 are connected in series between supply terminal $T_1$ of power source voltage Vcc and output terminal $T_2$.

For capacitors C1, C2, C3, C4, the electrodes on one side are connected to the cathodes of diodes D1, D2, D3, D4, respectively, and the electrodes on the other side are connected to nodes ND1, ND2, ND3, ND4 of charge pump driver (100).

Capacitor $C_{out}$ is connected between output terminal $T_2$ and ground potential GND, and it is for smoothening output voltage $V_{out}$.

The voltage supply circuit in this embodiment consists of a charge pump type booster. Driver (100) supplies driving currents to capacitors C1, C2, C3, C4 that form a charge pump. These capacitors perform charging/discharge alternately corresponding to the driving current supplied to them. As a result, voltage $V_{out}$ higher than power source voltage Vcc is obtained at output terminal $T_2$.

Also, as an example, FIG. 2 illustrates a booster composed of four booster sections. However, for a practical voltage supply circuit, the number of booster sections can be selected appropriately corresponding to power source voltage Vcc and the desired output voltage $V_{out}$.

In the following, the constitution of charge pump driver (100) will be considered.

As shown in the figure, charge pump driver (100) is composed of current sources IS1, IS2, pnp transistors Q1, Q2, . . . Q15, npn transistors P1, P2, . . . P15, and resistors R1, R2, R3.

As shown in the figure, differential clock signal CLK is input to the bases of transistors P1 and P2. The emitters of transistors P1 and P2 are connected to each other, and their connecting point is connected to current source IS1. That is, transistors P1 and P2 form a differential circuit, and current source IS1 supplies an operation current to said differential circuit.

Transistors Q1 and Q3 connected to the collectors of transistors P1 and P2 form the load of the differential circuit. Also, transistors Q1, Q2, Q9 and Q13 form a current mirror circuit, and transistors Q3, Q4, Q11 and Q15 form a current mirror circuit.

Differential clock signal CLK is input to the bases of transistors Q5 and Q6. The emitters of transistors Q5 and Q6 are connected to each other, and their connecting point is connected to current source IS2. That is, transistors Q5 and Q6 form a differential circuit, and current source IS2 supplies an operation current to said differential circuit.

Transistors P4 and P6 connected to the collectors of transistors Q5 and Q6 form the load of the differential circuit. Also, transistors P3, P4, P11 and P15 form a current mirror circuit, and transistors P5, P6, P9 and P13 form a current mirror circuit.

Transistor Q7, resistors R1, R2, R3 and transistor P7 are connected in series between power source voltage Vcc and ground potential GND. The emitter of transistor Q7 is connected to the supply line of power source voltage Vcc, and its base and collector are connected to resistor R1. The emitter of transistor P7 is grounded, and its base and collector are connected to resistor R3. From the connecting point between resistors R1 and R2, bias voltage $V_{bs1}$ is generated, and, from the connecting point between resistors R2 and R3, bias voltage $V_{bs2}$ is generated. Bias voltage $V_{bs1}$ is applied on the bases of transistors Q8, Q10, Q12 and Q14, and bias voltage $V_{bs2}$ is applied on the bases of transistors P8, P10, P12 and P14.

As explained above, electrodes on one side of capacitors C1, C2, C3 and C4 are connected to the cathodes of diodes D1, D2, D3 and D4, respectively, and the electrodes on the other side are connected to nodes ND1, ND2, ND3 and ND4, respectively. Transistors P9, Q9 and transistors P8, Q8 are connected to node ND1. Similarly, transistors P11, Q11 and transistors P10, Q10 are connected to node ND2. Transistors P13, Q13 and transistors P12, Q12 are connected to node ND3. In addition, transistors P15, Q15 and transistors P14, Q14 are connected to node ND4.

Corresponding to input clock signal CLK, transistors Q9, P9 connected to node ND1 supply driving currents $I_{s1}$ and $I_{s2}$, respectively. Also, as shown in FIG. 2, driving current $I_{s1}$ is input from the supply line of power source voltage Vcc through transistor Q9 to node ND1 as the so-called source current, and driving current $I_{S2}$ is pulled in from node ND1 through transistor P9 to ground potential GND as the so-called sink current. Corresponding to input clock signal CLK, current output is performed alternately with transistors P9 and Q9. Consequently, driving currents $I_{s1}$ and $I_{s2}$ are supplied alternately to node ND1. When source current $I_{s1}$ is input to node ND1, capacitor C1 is charged. On the other hand, when sink current $I_{s2}$ is pulled from node ND1 to the collector of transistor P9, capacitor C1 is discharged.

Transistors P13, Q13 that supply driving current to the $3^{rd}$-stage capacitor C3 work at the same timing as that of transistors P9, Q9. On the other hand, transistors P11, Q11 and P15, Q15 that supply driving currents to the $2^{nd}$-stage and $4^{th}$-stage capacitors C2 and C4 work at a timing opposite that of transistors P9, Q9. That is, when transistors P9, P13 and Q11, Q15 work, transistors P11, P15 and Q9, Q13 do not output driving current, and they are in a non-operation state. In this case, driving current $I_{s1}$ is supplied to nodes ND2 and ND4 by means of transistors Q11 and Q15.

On the other hand, when transistors P9, P13 and Q11, Q15 are in the non-operation state, transistors Q9 and Q13 supply source current to nodes ND1 and ND3, and transistors P11 and P15 pull sink current from nodes ND2 and ND4.

In the following, operation of the voltage supply circuit in this embodiment will be considered.

In the differential circuit composed of transistors P1 and P2, corresponding to clock signal CLK, transistors P1 and P2 become ON alternately. The current supplied by current source IS1 flows to the transistor that is ON. As a result, current flows alternately in transistors Q1 and Q3. For example, when a current flows in transistor Q1, by means of the current mirror circuit, driving current $I_{s1}$ is output to transistors Q9 and Q13. On the other hand, when a current flows in transistor Q3, driving current $I_{s1}$ is output to transistors Q11 and Q15 by means of the current mirror circuit.

Also, in the differential circuit composed of transistors Q5 and Q6, corresponding to clock signal CLK, transistors Q5 and Q6 become ON alternately. Current supplied from current source IS2 flows in the transistor that is ON. As a result, current flows in transistors P4 and P6 alternately. For example, when a current flows in transistor P4, by means of the current mirror circuit, driving current $I_{s2}$ flows in transistors P11 and P15. On the other hand, when a current flows in transistor P6, by means of the current mirror circuit, driving current $I_{s2}$ flows in transistors P9 and P13.

Corresponding to clock signal CLK, current flows in transistors Q1 and P4 during the half period of clock signal CLK when clock signal CLK is held on the high level. On the other hand, current flows in transistors Q3 and P6 during the half period of clock signal CLK when clock signal CLK is held on the low level.

When a current flows in transistors Q1 and P4, due to the current mirror circuit, driving current $I_{s1}$ is output from transistors Q9, Q13, and driving current $I_{s2}$ is pulled to transistors P11 and P15. Corresponding to this, driving current $I_{s1}$ is supplied to capacitors C1 and C3. Consequently, these capacitors are charged. On the other hand, current $I_{s2}$ is pulled from capacitor C2 to transistor P11, and current $I_{s2}$ is pulled from capacitor C4 to transistor P15. Consequently, these capacitors are discharged.

In the next half period of clock signal CLK, current flows in transistors Q3 and P6. Consequently, by means of the current mirror circuit, driving current $I_{S1}$ is output from transistors Q11, Q15, and driving current $I_{s2}$ is pulled into transistors P9, P13. Corresponding to this, driving current $I_{s1}$ is supplied to capacitors C2 and C4. Consequently, these capacitors are charged. On the other hand, current $I_{s2}$ is pulled from capacitor C1 to transistor P9 and current $I_{s2}$ is pulled from capacitor C3 to transistor P13. Consequently, these capacitors are discharged.

In this way, in each half period of clock signal CLK, capacitors C1, C3 and C2, C4 are charged/discharged alternately. Consequently, the charge stored in a former stage of capacitor in a certain half period of clock signal CLK is sent to the next stage of capacitor in the next half period of clock signal CLK. Consequently, as the position moves to the later stages, the voltage rises gradually. That is, boosted voltage $V_{out}$ higher than power source voltage Vcc is obtained from output terminal $T_2$.

Also, for the voltage supply circuit in this embodiment, a driving current is supplied by a current mirror circuit to the capacitors in the charge pump type booster. By controlling charge/discharge of the capacitors, a constant current is always supplied from power source Vcc to the charge pump type booster. Consequently, current spikes can be reduced, and, in company with the current spikes, the influence of crosstalk on an analog circuit can be suppressed, and the stability of operation of an analog circuit can be improved.

Figure 3A:
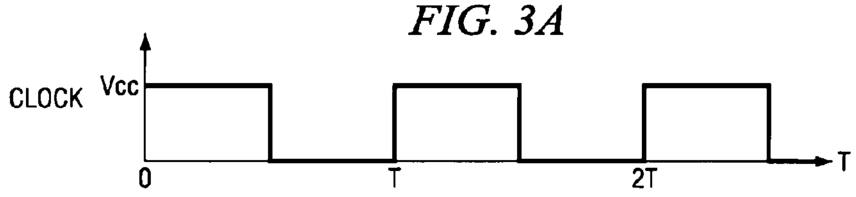
FIG. 3 is waveform diagram illustrating the signal waveform in the boosting operation in the second embodiment of the voltage supply circuit in this invention.
Figure 3B:
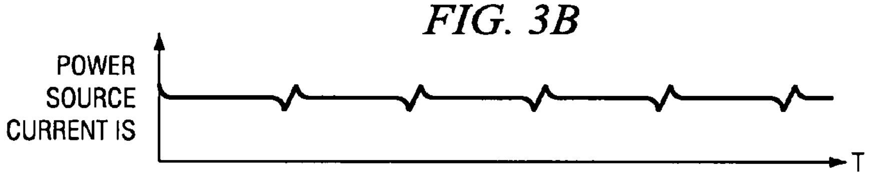
Figure 4:
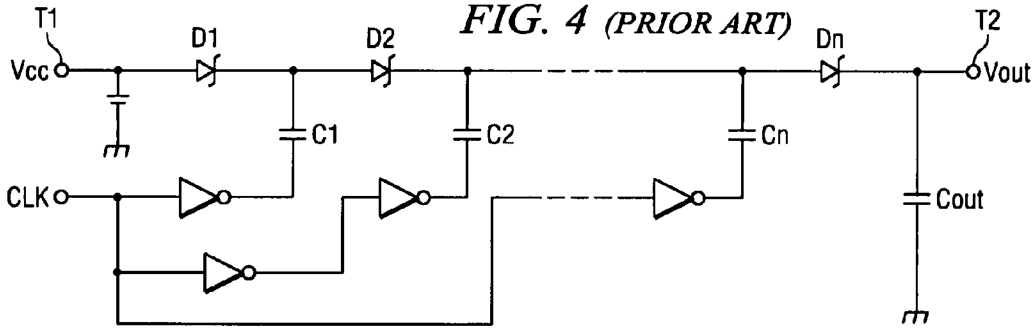
FIG. 4 (PRIOR ART)
FIG. 4 is a circuit diagram illustrating an example of the configuration of a voltage supply circuit using a conventional charge pump booster.
Figure 5A:
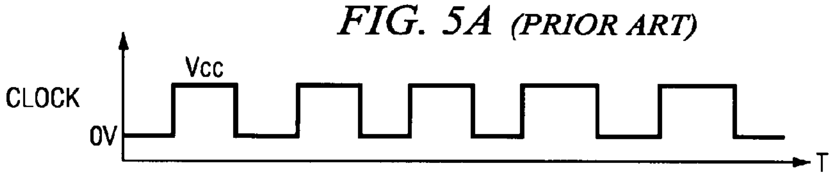
FIG. 5A (PRIOR ART)
FIG. 5 is a waveform diagram illustrating the signal waveform in a conventional current output circuit.
Figure 5B:
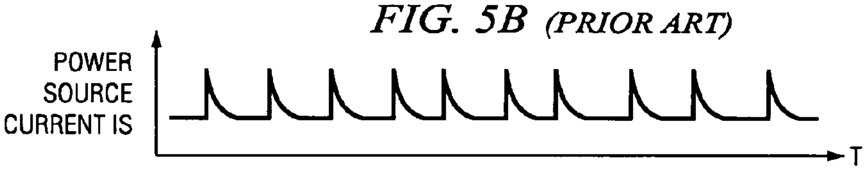
FIG. 5B (PRIOR ART)

FIG. 3 is a waveform diagram illustrating an example of power source current in the voltage supply circuit in this embodiment. As shown in this figure, although a minute variation in the power source current takes place in company with variation in the level of the clock signal CLK, the spike noise can be reduced significantly as compared to that of a conventional charge pump type booster.

As explained above, in the voltage supply circuit of this embodiment using a charge pump type booster, a current source circuit that supplies driving current by means of a current mirror circuit is set, and, corresponding to the input clock signal CLK, a source current and sink current are supplied alternately to capacitors in the various boosting stages. Consequently, the capacitors of the various boosting stages are charged and discharged alternately and repeatedly, so that the charge stored in the capacitor of a preceding stage is sequentially sent to the capacitor in the later stage, and the capacitor voltage rises gradually. Consequently, a boosted voltage higher than power source voltage Vcc can be obtained from the output terminal. Because a driving current is supplied to the capacitors by means of a current source, it is possible to maintain the power source current at nearly a constant level in the boosting operation, it is possible to suppress spike noise, and it is possible to minimize the influence on other analog circuits.

As explained above, for the voltage supply circuit using a charge pump type booster in this invention, by means of the driving current supplied from a current source, charge/discharge of capacitors is controlled, so that the power source current is maintained almost on a constant level in the boosting operation. As a result, it is possible to suppress generation of current spikes, it is possible to reduce the influence of noise on other analog circuits due to crosstalk, and it is possible to improve the operation stability of the analog circuits.

In addition, for the voltage supply circuit of this embodiment, compared with a conventional voltage driving type charge pump booster, there is little increase in the scale of the circuit, rise in cost is suppressed, and yet a much higher performance of the voltage supply circuit can be realized.

The invention claimed is:

1. A voltage supply circuit comprising:

a first diode with its anode connected to a voltage supply terminal;

a first capacitor connected between the cathode of said first diode and a first node;

a first controllable constant current source that is connected between the voltage supply terminal and said first node and supplies a first current to said first node corresponding to a first clock signal;

a second controllable constant current source that is connected between said first node and ground potential, and supplies a second current to said first node corresponding to a second clock signal that is complementary to said first clock signal;

a second diode connected to the cathode of said first diode;

a second capacitor connected between the cathode of said second diode and a second node;

a third controllable constant current source that is connected between the voltage supply terminal and said second node, and supplies a third current to said second node corresponding to said second clock signal;

and a fourth controllable constant current source that is connected between said second node and the ground potential, and supplies a fourth current to said second node corresponding to said first clock signal.

2. The voltage supply circuit of claim 1 wherein each of the first, second, third and fourth controllable constant current sources are controllable between off states and constant current states.

3. A voltage supply circuit comprising:

a first diode with its anode connected to a voltage supply terminal;

a first capacitor connected between the cathode of said first diode and a first node;

a first controllable constant current source that is connected between the voltage supply terminal and said first node and supplies a first current to said first node corresponding to a first clock signal;

a second controllable constant current source that is connected between said first node and ground potential, and supplies a second current to said first node corresponding to a second clock signal that is complementary to said first clock signal;

a second diode connected to the cathode of said first diode;

a second capacitor connected between the cathode of said second diode and a second node;

a third controllable constant current source that is connected between the voltage supply terminal and said second node, and supplies a third current to said second node corresponding to said second clock signal;

and a fourth controllable constant current source that is connected between said second node and the ground potential, and supplies a fourth current to said second node corresponding to said first clock signal; and a voltage holding means for holding said first node and said second node within a prescribed voltage range.

4. The voltage supply circuit described in claim 2 wherein the voltage holding means comprises;

a first npn transistor that is connected between the voltage supply terminal and said first node, and has a first bias voltage applied to its base;

a second npn transistor which is connected between the voltage supply terminal and said second node, and has said first bias voltage applied to its base;

a first pnp transistor that is connected between said first node and the ground potential, and has a second bias voltage higher than said first bias voltage applied to its base;

and a second pnp transistor that is connected between said second node and the ground potential, and has said second bias voltage applied to its base.

5. The voltage supply circuit described in claim 3 wherein said first and second diodes are Schottky diodes.

6. The voltage supply circuit described in claim 4 wherein said first and second diodes are Schottky diodes.

7. In a charge pump DC to DC converter having a plurality of capacitors alternately charged and discharged, the charge stored in a capacitor of a preceding stage being subsequently sent to a later capacitor stage, the improvement comprising:

a plurality of constant current sources each of the constant current sources for charging a respective one of the plurality of capacitors with a constant current, whereby spike noise is reduced.

* * * * *